US 11,239,841 B1

United States Patent
Chen et al.

(10) Patent No.: US 11,239,841 B1
(45) Date of Patent: Feb. 1, 2022

(54) DIODE FAULT DETECTION

(71) Applicant: Wisk Aero LLC, Mountain View, CA (US)

(72) Inventors: Hongxia Chen, Mountain View, CA (US); Rui Gao, Mountain View, CA (US); Lewis Romeo Hom, Mountain View, CA (US); Geoffrey Alan Long, Montara, CA (US)

(73) Assignee: Wisk Aero LLC, Mountain View, CA (US)

( * ) Notice: Subject to any disclaimer, the term of this patent is extended or adjusted under 35 U.S.C. 154(b) by 0 days.

(21) Appl. No.: 17/193,883

(22) Filed: Mar. 5, 2021

(51) Int. Cl.
*G01R 31/26* (2020.01)
*G01R 31/40* (2020.01)
*G01R 19/12* (2006.01)
*G01R 19/165* (2006.01)
*H03K 17/74* (2006.01)
*H03K 17/082* (2006.01)

(52) U.S. Cl.
CPC ......... *H03K 17/74* (2013.01); *H03K 17/0822* (2013.01); *H03K 2217/0081* (2013.01)

(58) Field of Classification Search
None
See application file for complete search history.

(56) References Cited

U.S. PATENT DOCUMENTS

| 4,186,391 | A  | * | 1/1980  | Wang ................. G01R 31/2632 340/645 |
| 8,896,315 | B1 | * | 11/2014 | Davies ................. H02J 7/0019 324/434 |
| 9,835,688 | B2 | * | 12/2017 | Zhu ...................... H01M 10/482 |
| 10,023,054 | B2 | * | 7/2018  | Long ........................ B60L 58/22 |
| 10,035,607 | B2 | * | 7/2018  | Wangemann ........... B60L 50/90 |
| 10,338,121 | B2 | * | 7/2019  | Butler ................. H02H 1/0015 |
| 10,744,890 | B2 | * | 8/2020  | Long ..................... H02J 7/0018 |
| 11,016,140 | B1 | * | 5/2021  | Long .................... H01M 50/572 |

* cited by examiner

*Primary Examiner* — Kenneth B Wells
(74) *Attorney, Agent, or Firm* — Kilpatrick Townsend & Stockton LLP

(57) ABSTRACT

A power delivery system includes a controller, configured to receive a voltage indication signal indicating a measured voltage of a battery management system and to determine whether first and second diodes of the battery management system are faulty based on the voltage indication signal. The controller is also configured to respectively receive first and second current indication signals from first and second current sensors of the battery management system and to determine whether the first and second diodes of the first battery management system are faulty based on the first and second current indication signals.

21 Claims, 7 Drawing Sheets

505 

```
┌─────────────────────────────────────┐  515
│ Disconnect all batteries of all     │
│ battery management systems from     │
│ a power supply                      │
└─────────────────────────────────────┘
                  │
                  ▼
┌─────────────────────────────────────┐  525
│ Connect a battery of a first        │
│ battery management system to a      │
│ power supply node                   │
└─────────────────────────────────────┘
                  │
                  ▼
┌─────────────────────────────────────┐  535
│ Disconnect the battery of the first │
│ battery management system from the  │
│ power supply node                   │
└─────────────────────────────────────┘
                  │
                  ▼
┌─────────────────────────────────────┐  545
│ Determine a voltage of the first    │
│ battery management system           │
└─────────────────────────────────────┘
                  │
                  ▼
┌─────────────────────────────────────┐  555
│ Determine whether a diode of the    │
│ first battery management system     │
│ is open                             │
└─────────────────────────────────────┘
```

FIG. 5

DIODE FAULT DETECTION

TECHNICAL FIELD

The subject matter described herein relates to power delivery systems, and more particularly to power delivery systems for aircraft.

BACKGROUND

Battery-powered systems may include multiple batteries to drive multiple loads. For example, an electric aircraft or other vehicle may include a plurality of high voltage batteries or battery management systems that power a propulsion system comprising multiple loads, such as a plurality of electric motors. This arrangement may be used to provide redundancy and/or fault tolerance, for example.

Such a system may include contactors that are open to disconnect the electric motors from the battery management systems when the propulsion system is not in use and are closed when the propulsion system is in use. This approach ensures safety by reducing the amount of the system that has high voltage.

The system may include diodes interposed between the respective batteries and the loads. In the case of a battery failure in which a diode fails short, the affected battery could have a substantially lower voltage than the other batteries. This would cause a large amount of current to flow from the other batteries to the low voltage battery and there is a risk that other structures provided to protect the other batteries, such as battery fuses, might fail or be damaged.

The diodes may also enable batteries to discharge more evenly in the scenario where each of the batteries has a different state of health.

These diodes may be important to the system. Therefore, it would be desirable to be able to have a way to determine if the diodes have failed. One possible failure mode is one that one or more diodes is shorted or substantially shorted such that the diode no longer prevents current from flowing from cathode to anode. Another possible failure mode is that one or more diodes is open, no longer conducting current from cathode to anode or from anode to cathode.

SUMMARY

One inventive aspect is a power delivery system for an aircraft. The power delivery system includes a plurality of battery management systems, each including a battery system, first and second diodes configured to conduct current from the battery system to a power supply node, a first current sensor configured to sense a first current of the first diode, a second current sensor configured to sense a second current of the second diode, a first switch configured to control a conductivity of a first current path between the battery system to the first and second diodes, and a second switch configured to control a conductivity of a second current path between the battery system to the first and second diodes. The power delivery system also includes a controller, where the controller is configured to receive a voltage indication signal indicating a measured voltage of a first battery management system of the battery management systems and to determine whether the first and second diodes of the first battery management system are faulty based on the voltage indication signal, and where the controller is configured to respectively receive first and second current indication signals from the first and second current sensors of the first battery management system and to determine whether the first and second diodes of the first battery management system are faulty based on the first and second current indication signals.

In some embodiments, the controller is configured to determine whether the first and second diodes are open based on the voltage indication signal.

In some embodiments, the controller is configured to determine whether either of the first and second diodes are shorted based on the voltage indication signal.

In some embodiments, the first current path has a first impedance when conductive, the second current path has a second impedance when conductive, and the first impedance is greater than the second impedance.

In some embodiments, the controller is configured to electrically connect the battery system of a second battery management to the power supply node, and to determine whether either of the first and second diodes of the first battery management system are shorted based on the voltage indication signal.

In some embodiments, the controller is configured to determine that either or both of the first and second diodes of the first battery management system are shorted based on the voltage indication signal indicating that the measured voltage of the first battery management system is greater than a threshold.

In some embodiments, the controller is configured to determine whether either of the first and second diodes of the first battery management system are shorted during a preflight test while the aircraft is not flying.

In some embodiments, the controller is configured to electrically connect the battery system of the first battery management system to the first and second diodes of the first battery management system, to electrically disconnect the battery system of the first battery management system from the first and second diodes of the first battery management system, and to determine whether either of the first and second diodes of the first battery management system are open based on the voltage indication signal.

In some embodiments, the controller is configured to determine that the first and second diodes of the first battery management system are open based on the voltage indication signal indicating that the measured voltage of the first battery management system is greater than a threshold.

In some embodiments, the controller is configured to determine whether either of the first and second diodes of the first battery management system are open during a preflight test while the aircraft is not flying.

In some embodiments, the controller is configured to determine whether either of the first and second diodes of the first battery management system is open based on the first and second current indication signals.

In some embodiments, the controller is configured to determine whether the first diode of the first battery management system is open based on the first current indication signal being less than a threshold, and the controller is configured to determine whether the second diode of the first battery management system is open based on the second current indication signal being less than the threshold.

In some embodiments, the controller is configured to determine whether either of the first and second diodes of the first battery management system is open while the aircraft is flying.

In some embodiments, the controller is configured to determine whether either of the first and second diodes is shorted based on the first and second current indication signals.

In some embodiments, the controller is configured to determine whether the first diode of the first battery management system is shorted based on the first current indication signal being greater than a threshold, and where the controller is configured to determine whether the second diode of the first battery management system is shorted based on the second current indication signal being greater than the threshold.

In some embodiments, the controller is configured to determine whether either of the first and second diodes of the first battery management system is shorted while the aircraft is flying.

Another inventive aspect is a method of operating a power delivery system for an aircraft. The power delivery system includes a plurality of battery management systems, each including a battery system, and first and second diodes configured to conduct current from the battery system to a power supply node. The method includes: with a controller, receiving a voltage indication signal indicating a measured voltage of a first battery management system of the battery management systems, with the controller, determining whether the first and second diodes of the first battery management system are faulty based on the voltage indication signal, with the controller, respectively receiving first and second current indication signals from the first battery management system, and with the controller, determining whether the first and second diodes of the first battery management system are faulty based on the first and second current indication signals.

In some embodiments, the controller is configured to determine whether either of the first and second diodes of the first battery management system is shorted based on the first and second current indication signals while the aircraft is flying.

In some embodiments, the controller is configured to determine whether either of the first and second diodes of the first battery management system is open based on the first and second current indication signals while the aircraft is flying.

In some embodiments, the controller is configured to determine whether either of the first and second diodes of the first battery management system is shorted based on the voltage indication signal while the aircraft is not flying.

In some embodiments, the controller is configured to determine whether the first and second diodes of the first battery management system are open based on the voltage indication signal while the aircraft is not flying.

BRIEF DESCRIPTION OF DRAWINGS

The accompanying drawings, which are incorporated in and constitute a part of this specification, show certain aspects of the subject matter disclosed herein and, together with the description, help explain some of the principles associated with the disclosed implementations.

FIG. 5 is a flowchart diagram of a method of detecting an open diode, for example, in a power management system, such as the power management system of FIG. 3.

When practical, similar reference numbers denote similar structures, features, or elements.

DETAILED DESCRIPTION

Particular embodiments of the invention are illustrated herein in conjunction with the drawings.

Various details are set forth herein as they relate to certain embodiments. However, the invention can also be implemented in ways which are different from those described herein. Modifications can be made to the discussed embodiments by those skilled in the art without departing from the invention. Therefore, the invention is not limited to particular embodiments disclosed herein.

Figure 1:
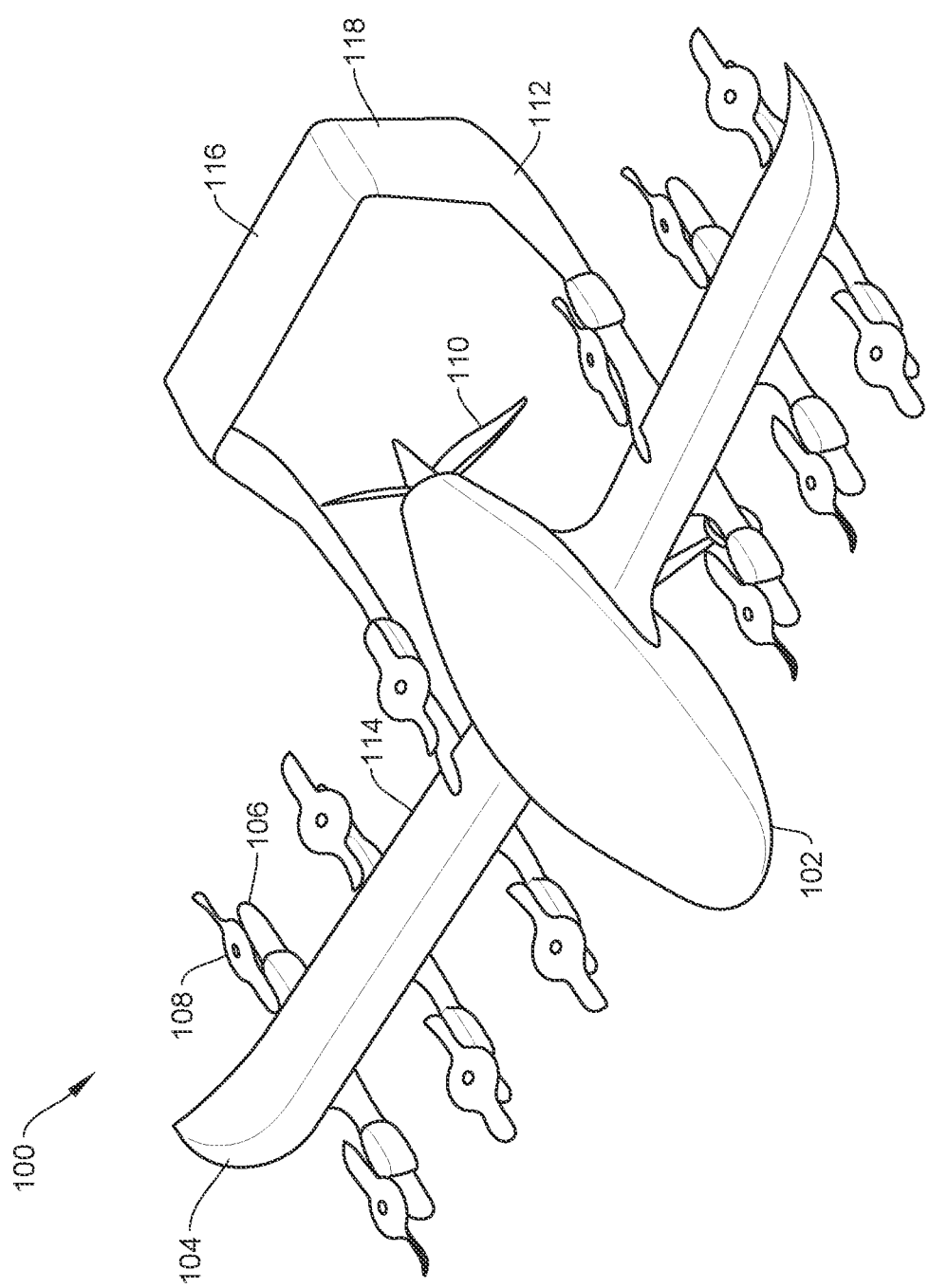
FIG. 1 is a diagram illustrating an embodiment of an electric vertical takeoff and land (VTOL) aircraft.

FIG. 1 is a diagram illustrating an embodiment of an electric vertical takeoff and land (VTOL) aircraft. In various embodiments, a power delivery system such as those discussed elsewhere herein, may be embodied in an aircraft such as aircraft 100 of FIG. 1. In the example shown, aircraft 100 includes a fuselage (body) 102 and wings 104. A set of three underwing booms 106 is provided under each wing. Each boom 106 has two lift fans 108 mounted thereon, one forward of the wing and one aft. Each lift fan 108 may be driven by an associated drive mechanism, such as a dedicated electric motor. A plurality of batteries of the power delivery system may be used to drive the lift fans 108.

In the example shown in FIG. 1, propeller 110 is mounted on the fuselage 102 and configured to push the aircraft through the air in the forward (e.g., x axis) direction. The propeller 110 is positioned between a pair of booms 112 that extend aft and are joined at their aft end by a tail structure on which aerodynamic control surfaces including elevators 116 and rudder 118 are mounted. Additional control surfaces include ailerons 114 mounted on the trailing edge of wings 104.

In various embodiments, aircraft 100 includes a flight control system that embodies an aerodynamic model. For a given set of desired forces and moments, the flight control system uses the model to control a set of actuators and for each a corresponding set of actuator parameters to achieve the desired forces and moments for desired take off, flight, and landing operation. For example, all or a subset of actuators for components including the lift fans 108 and/or selected ones of them; propeller 110; and control surfaces such as ailerons 114, elevators 116, and/or rudders 118 may be selected, and for each selected actuator, an associated set of parameters may be determined and applied. For example, a corresponding revolutions per minute (RPM) or torque, for each lift fan 108, or position angles for each selected control surface, may be controlled by setting actuator parameters associated therewith.

In various embodiments, a plurality of battery management systems may be provided to power motors associated with the respective lift fans 108. Each battery management system may include one or more diodes. In various embodiments, each diode may be monitored by an associated battery diode fault detection system. A flight control or other monitoring system included in the aircraft 100 may be used in various embodiments to monitor for diode failures, for example, as disclosed herein. For example, the flight control or other monitoring system may be configured to perform the processes discussed herein to detect diode failure and respond thereto.

Figure 2:
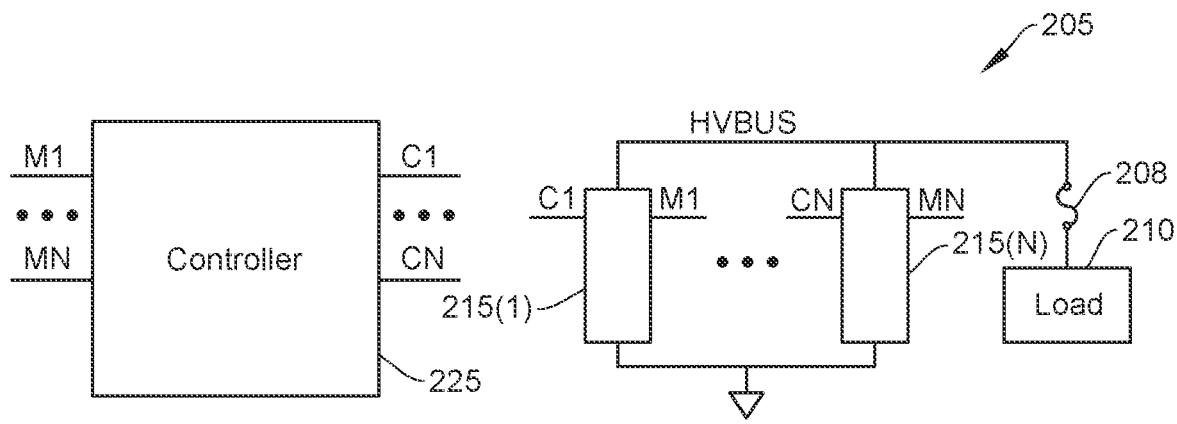
FIG. 2 illustrates a schematic diagram of a power distribution system which may be used, for example in the aircraft of FIG. 1.

FIG. 2 illustrates a schematic diagram of a power distribution system 205 which may be used, for example in the aircraft 100. The power distribution system 205 includes controller 225, and battery management systems 215(1)-215(N).

Battery management systems 215(1)-215(N) are connected to load 210 through fuse 208. In some embodiments, load 210 comprises multiple loads. For example load 210 may include multiple motors, for example, each configured to rotate a lift fan or a propeller of an aircraft. In these embodiments, fuse 208 may include multiple fuses, each connected to power supply node HVBUS and to one of the loads of load 210.

Each of battery management systems 215(1)-215(N) includes input node or bus Cx and includes output node or bus Mx, where x corresponds with the instance number of the battery management systems 215(1)-215(N).

The battery management systems 215(1)-215(N) are each configured to receive control commands at input node or bus Cx. The control commands may, for example, cause the battery management systems 215(1)-215(N) to selectively provide power to power supply node HVBUS. The control commands may additionally or alternatively cause the battery management systems 215(1)-215(N) to perform other functions.

In addition, the battery management systems 215(1)-215(N) are each configured to generate measurement signals at output node or bus Mx. The measurement signals may, for example, indicate state values of one or more parameters of the battery management systems 215(1)-215(N). For example, the measurement signals may indicate one or more node voltages or branch currents of the battery management systems 215(1)-215(N).

Controller 225 is configured to generate the control commands for the battery management systems 215(1)-215(N). For example, controller 225 may receive a signal indicating a command to provide power to load 210. In response to the signal, controller 225 is configured to generate control commands for battery management systems 215(1)-215(N) which cause battery management systems 215(1)-215(N) to provide power to load 210.

Controller 225 is also configured to receive the measurement signals from the battery management systems 215(1)-215(N). In some embodiments, controller 225 is configured to generate the control commands for the battery management systems 215(1)-215(N) based at least in part on the received measurement signals. In some embodiments, controller 225 is additionally or alternatively configured to generate one or more status signals based at least in part on the received measurement signals, where the status signals indicate a status of one or more components of the battery management systems 215(1)-215(N), or of the battery management systems 215(1)-215(N) themselves.

Figure 3:
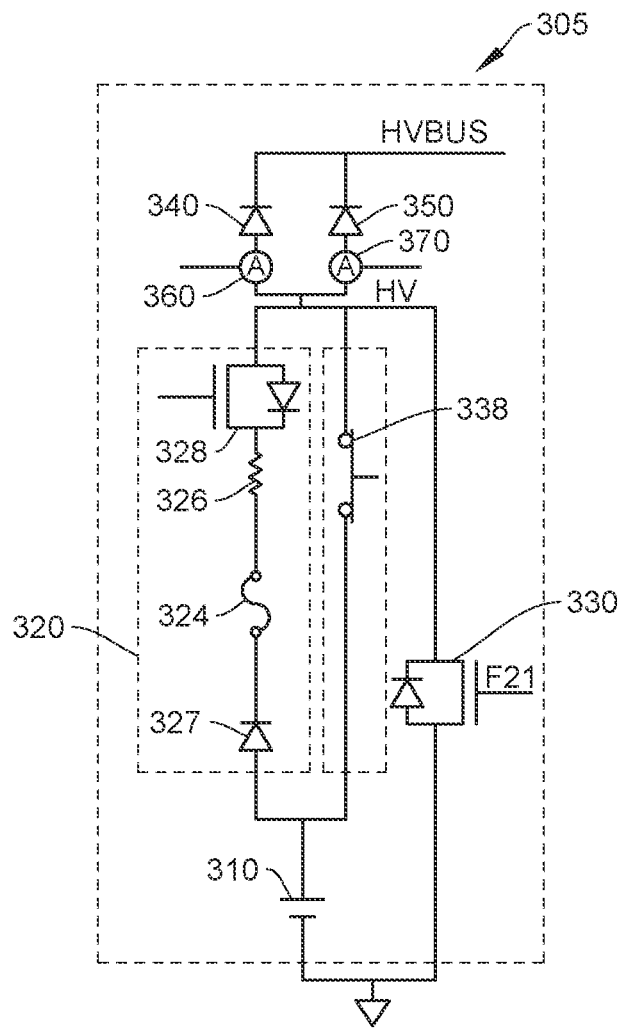
FIG. 3 illustrates a schematic diagram of a battery management system, according to some embodiments.

FIG. 3 illustrates a schematic diagram of an exemplary battery management system 305, according to some embodiments. The exemplary battery management system 305 may correspond to any one or more of the battery management systems 215(1)-215(N) of FIG. 2. Battery management system 305 includes battery or battery system 310, first current path 320, optional second current path 330, first and second diodes 340 and 350, and first and second current monitors 360 and 370.

Battery system 310 is configured to provide power to a load through power supply node HVBUS using one or more batteries. For example, battery system 310 may include multiple batteries in serial and parallel combinations configured to provide sufficient power to the load at a desired voltage or within a desired voltage range. Battery system 310 may additionally include one or more fuses. For example, each battery or each serially connected group of batteries may be serially connected with a fuse.

First current path 320 selectively provides a conductive current path between battery system 310 and node HV. First current path 320 includes diode 327, fuse 324, resistive element 326, and switch 328 connected in series in the recited order between battery system 310 and node HV. In alternative embodiments, diode 327, fuse 324, resistive element 326, and switch 328 may be serially connected in a different order from that illustrated in FIG. 3.

In response to a signal at the gate of switch 328, switch 328 becomes conductive or nonconductive, as understood by those of skill in the art. In response to switch 328 being conductive, first current path 320 provides a conductive path between battery system 310 and node HV, where the conductive path has an impedance substantially or about equal to the impedance of resistive element 326. In addition, because diode 327 is rectifying, the conductive path conducts current from battery system 310 to node HV and does not conduct current from node HV to battery system 310.

In the illustrated embodiment, switch 328 includes a field effect transistor (FET) device. In alternative embodiments, other switch types may be used.

Optional second current path 330 selectively provides a conductive current path between battery system 310 and node HV. First current path 320 includes switch 338 connected in series between battery system 310 and node HV. In some embodiments, optional second current path 330 is not included.

In response to a signal at the gate of switch 338, switch 338 becomes conductive or nonconductive, as understood by those of skill in the art. In response to switch 338 being conductive, second current path 330 provides a conductive path between battery system 310 and node HV, where the conductive path has an impedance which is lower than or much lower than the impedance of resistive element 326. For example, the impedance of resistive element 326 may be greater than about 10, about 100, about 1,000, or about 10,000 times the impedance of resistive element 326.

In the illustrated embodiment, switch 338 includes a contactor or a relay device. In alternative embodiments, other switch types may be used.

As illustrated, the serially connected first current monitor 360 and first diode 340 is connected in parallel with serially connected second current monitor 370 and second diode 350.

Each of the serially connected first current monitor 360 and first diode 340, and the serially connected second current monitor 370 and second diode 350 is configured to conduct current from node HV to power supply node HVBUS, and to not conduct current from power supply node HVBUS to node HV.

First current monitor 360 is configured to detect current flowing between power supply node HVBUS and node HV through diode 340, and to generate a first current measurement signal indicating a magnitude and direction of the detected current. In some embodiments, first current monitor 360 includes a Hall effect current sensor. In alternative embodiments, different current monitors may be used. In some embodiments, the first current measurement signal may additionally or alternatively indicate other aspects of the current flowing from the first battery management system to the power supply node HVBUS, as understood by those of skill in the art.

Second current monitor 370 is configured to detect current flowing between power supply node HVBUS and node HV through diode 350, and to generate a second current measurement signal indicating a magnitude and direction of the detected current. In some embodiments, second current monitor 370 includes a Hall effect current sensor. In alternative embodiments, different current monitors may be used. In some embodiments, the first current measurement signal may additionally or alternatively indicate other aspects of the current flowing from the first battery management system to the power supply node HVBUS, as understood by those of skill in the art.

In the illustrated embodiment, battery management system 305 is configured to receive a first control signal at the gate of switch 328 and to receive a second control signal at the gate of switch 338. The first and second control signals may be received, for example, from a controller, such as controller 225 of FIG. 2. As understood by those of skill in the art, the conductivity states of first and second switches 328 and 338 are controlled according to the received first and second control signals.

Furthermore, in the illustrated embodiment, battery management system 305 is configured to generate first and second current measurement signals, respectively indicating a magnitude and direction of the respective currents flowing between power supply node HVBUS and node HV through diodes 340 and 350.

Pre-Flight Diode Test System

In some embodiments, a power system for an aviation system includes a plurality of battery management systems, each including one or more batteries, a diode configured to conduct current from the batteries to a power supply conductor, a first switch configured to conditionally electrically connect the batteries to the diode, and a second switch configured to conditionally electrically connect the batteries to the diode. The power system also includes a controller, where the controller is configured to control the conductivity of the first switch of each particular battery management system so as to conditionally test the diode of the particular battery management system, and where the controller is configured to control the conductivity of the second switch of each particular battery management system to conditionally cause the particular battery management system to provide current to the power supply conductor.

The power system may be used, for example, for pre-flight diode testing to determine a pre-flight diode short or a diode open in one or more battery management systems of the power system, as described below in greater detail.

Pre-Flight Diode Short Test Method

Some embodiments include a method of operating a power system for an aviation system, where the power system includes a plurality of battery management systems, each including a battery, a diode, first and second switches each configured to selectively conduct current from the battery to the diode, and a controller, and where the method includes: with the controller of a first battery management system of the battery management systems, causing at least one of the first and second switches of the first battery management system to be conductive, whereby current from the battery of the first battery management system is conducted to a power supply conductor; with the controller of a second battery management system of the battery management systems, causing the first and second switches of the second battery management system to be nonconductive; with the controller of the second battery management system, determining a voltage of the second battery management system; and, with the controller of the second battery management system, determining whether the diode of the second battery management system has a short based on the determined voltage of the second battery management system.

Figure 4:
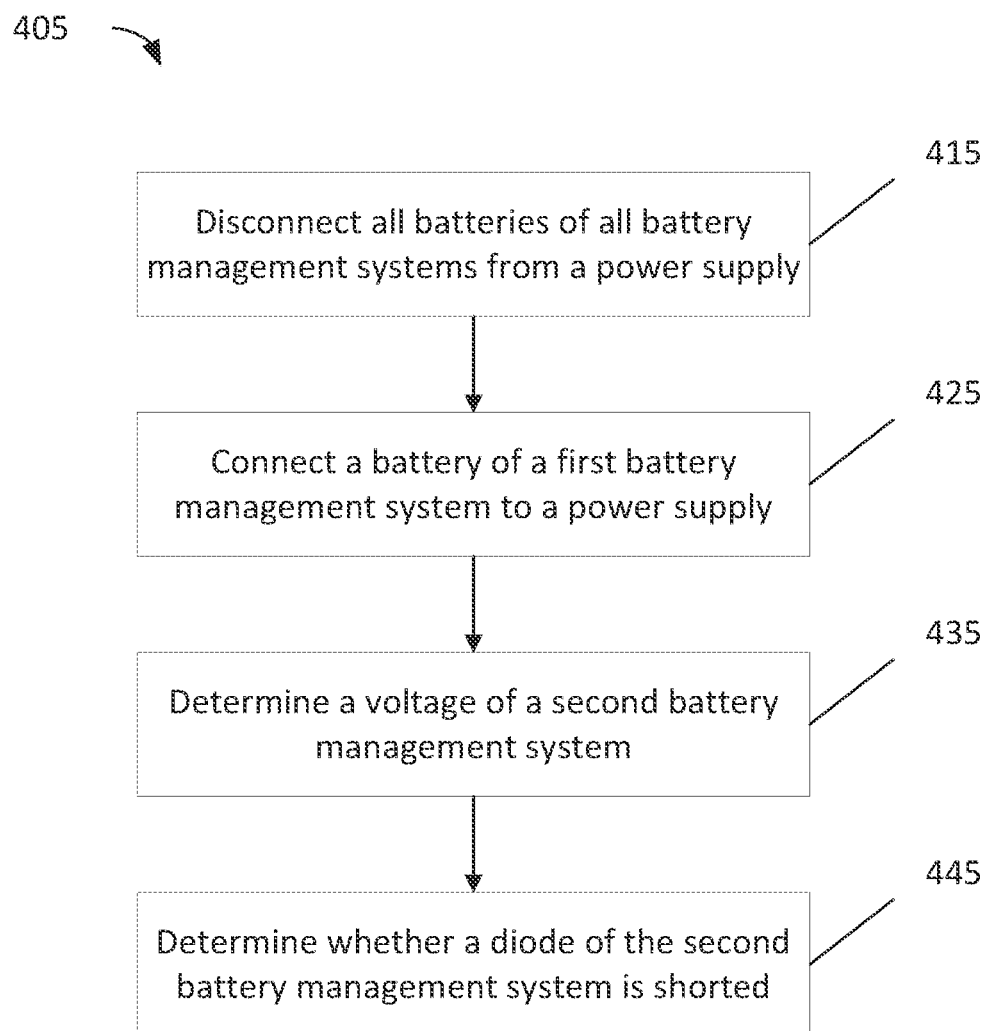
FIG. 4 is a flowchart diagram of a method of detecting a short in a diode, for example, in a power management system, such as the power management system of FIG. 3.

FIG. 4 is a flowchart diagram of a method 405 of detecting a short in a diode, for example, in a power management system, such as power management system 305, for example, used in a power distribution system used, such as power distribution system 205, used, for example, in an aircraft, such as aircraft 100. The method 405 may be used, for example, as a pre-flight diode test routine for aircraft 100.

The method may be performed, for example by a processor or a controller, such as controller 225.

At 415, the controller causes all batteries of all battery management systems connected to the power supply node to be electrically disconnected from the power supply node, for example, connected to a load.

For example, the controller may cause switches 328 and 338 of each battery management system to be nonconductive, such that battery system 310 of the battery management systems are electrically disconnected from the power supply node HVBUS. As a result, the load may not receive power from the battery systems 310 of the battery management systems, and does not function. Additionally, the load discharges the power supply node HVBUS, such that the voltage at the power supply node HVBUS becomes equal or substantially equal to a ground voltage.

At 425, the controller causes a first battery management system to electrically connect one or more batteries of the first battery management system to the power supply node, and therefore to a load connected thereto.

For example, the controller may cause either or both of switches 328 and 338 of a first battery management system to be conductive, such that battery system 310 of the first battery management system is electrically connected with a power supply node HVBUS. As a result, a load may receive power from battery system 310 of the first battery management system, and may accordingly function. If the controller causes switch 328 of the first battery management system to be conductive and does not cause switch 338 of the first battery management system to be conductive, the current from battery system 310 to the load will be less than if the controller were to cause switch 338 of the first battery management system to be conductive and to not cause switch 328 of the first battery management system to be conductive.

In some embodiments, the load may have multiple functional modes, and the power from the battery system 310 of the first battery management system may cause the load to function in one or more of the functional modes of the load. For example, the load may include a motor for a lift fan 108 of an aircraft and/or a motor for a propeller 110 of the aircraft, such as aircraft 100, where the motor or motors have a first functional mode which causes the fan and/or propeller to rotate, and have a second functional mode which causes the motor or motors or a component of the motor or motors to sink current without causing the fan and/or propeller to rotate. The motor or motors may operate in the first functional mode while the aircraft is in flight. The motor or motors may operate in the second functional mode while the aircraft is on the ground not flying, for example, during a preflight test.

Because the switches 328 and 338 of a second battery management system are nonconductive, and because the internal nodes of the second battery management system are isolated from the power supply node HVBUS by the first and second diodes 340 and 350 of the second battery management system, the voltages at the internal nodes of the second battery management system are not affected by the voltage at the power supply node HVBUS resulting from the power supply node HVBUS being electrically connected with the battery system 310 of the first battery management system. However, if either of the first and second diodes 340 and 350 of the second battery management system are faulty, either of the first and second diodes 340 and 350 of the second battery management system may conduct current from the power supply node HVBUS to the internal nodes of the second battery management system.

At 435, the controller receives a voltage indication signal and determines a voltage of an internal node of the second battery management system based on the voltage indication signal, where the internal node is expected to be electrically isolated from the power supply node HVBUS by one or more diodes of the second battery management system and is electrically isolated from the battery system of the second battery management system.

For example, the controller may determine the voltage of internal node HV of the second battery management system, where the internal node HV is expected to be electrically isolated from the power supply node HVBUS by the first and second diodes 340 and 350 of the second battery management system and is electrically isolated from the battery system of the second battery management system because of switches 328 and 338 of the second battery management system being nonconductive.

At 445, based on the determined voltage of the internal node of the second battery management system, the controller determines whether the diodes of the second battery management system is shorted, or not sufficiently electrically isolating the second battery management system from the power supply node HVBUS. For example, if the determined voltage of the internal node is greater than a threshold voltage, the controller may determine that either or both of the diodes of the second battery management system is shorted, or is not sufficiently electrically isolating the second battery management system from the power supply node HVBUS.

For example, as part of a diode test routine, such as a pre-flight test routine, the controller may determine whether the voltage of internal node HV of the second battery management system is greater than a threshold voltage. If the controller determines that the voltage of the internal node HV of the second battery management system is less than the threshold voltage, because switches 328 and 338 of the second battery management system are nonconductive, the voltage of the internal node HV of the second battery management system being less than the threshold voltage indicates that the diodes 340 and 350 of the second battery management system are functioning, and effectively isolate the internal node HV of the second battery management system from the power supply node HVBUS. If the controller determines that the voltage of the internal node HV of the second battery management system is greater than the threshold, because switches 328 and 338 of the second battery management system are nonconductive, the voltage of the internal node HV of the second battery management system being greater than the threshold voltage indicates that either or both of diodes 340 and 350 of the second battery management system are not functioning properly, and are not effectively isolating the internal node HV of the second battery management system from the power supply node HVBUS. As a result, the controller determines diodes 340 and 350 of the second battery management system to be shorted.

In some embodiments, if the controller determines that the voltage of the internal node HV of the first battery management system is equal to the threshold voltage, the controller determines that the diodes 340 and 350 of the second battery management system are functioning, and effectively isolate the internal node HV of the second battery management system from the power supply node HVBUS. In some embodiments, if the controller determines that the voltage of the internal node HV of the first battery management system is equal to the threshold voltage, the controller determines that either or both of diodes 340 and 350 of the second battery management system are not functioning properly, and are not effectively isolating the internal node HV of the second battery management system from the power supply node HVBUS. As a result, the controller determines diodes 340 and 350 of the first battery management system to be shorted.

In some embodiments, as part of a diode test routine, such as a pre-flight test routine, in response to determining that diodes 340 and 350 of the second battery management system are shorted, the controller provides a signal indicating faulty diodes. In response to the signal, a pilot, a user, or an automatic system may cause one or more remedial actions to be taken. In some embodiments, in response to determining that diodes 340 and 350 of the second battery management system are shorted, the controller prevents switches 328 and 338 of the second battery management system from becoming conductive.

In alternative embodiments, the controller may determine whether either of diodes 340 and 350 of the second battery management system are shorted based on whether current measurement signals from the current monitors 360 and 370 of the second battery management system indicate current flowing from the power supply node HVBUS to the second battery management system in response to the controller, at 425, causing the first battery management system to electrically connect one or more batteries of the first battery management system to the power supply node HVBUS, as understood by those of ordinary skill in the art.

The threshold voltage used at 445 may, for example, be determined based on a reference voltage. For example, the reference voltage may be based on a measurement or an expected value of the voltage at the power supply node HVBUS or of the battery system 310 of the first battery management system. In some embodiments, the controller may determine the threshold voltage to be a fraction of the reference voltage. For example, the controller may calculate the threshold voltage as about 0.05, about 0.1, about 0.2, about 0.5, or another factor times the reference voltage.

In some embodiments, prior to performing the method of FIG. 4, a test is performed to verify functionality of the battery system 310 of the first battery management system. In some embodiments, performing the method of FIG. 4 is conditioned on the test of the battery system 310 of the first battery management system verifying its functionality. In some embodiments, prior to performing the method of FIG. 4, a test is performed to verify functionality of the battery system 310 of the second battery management system. In some embodiments, performing the method of FIG. 4 is conditioned on the test of the battery system 310 of the second battery management system verifying its functionality. In some embodiments, prior to performing the method of FIG. 4, a test is performed to verify functionality of the battery systems 310 of the all battery management systems of the power delivery system. In some embodiments, performing the method of FIG. 4 is conditioned on the test of the battery systems 310 of all of the battery management systems verifying their functionality.

In some embodiments, the method of FIG. 4 is repeated so as to determine whether a diode of one or more battery management systems other than the second battery management system is shorted. In some embodiments, the method of FIG. 4 is repeated so as to determine whether one or more diodes of all of the battery management systems of the power delivery system is shorted.

In some embodiments, the method of FIG. 4 is repeated so as to determine whether a diode of the first battery management system is shorted. For example, in the repeated instance of method 405, the second, or another battery management system may be or act as "the first battery management system" of the method, as described, and the first battery management system may be or act as "the second battery management system" of the method, as described.

In some embodiments, steps 435 and 445 may be repeated so as to determine whether a diode of one or more other battery management systems, different from the first and second battery management systems is shorted. In some embodiments, the diodes of the second and at least one of the other battery management systems are, accordingly, tested simultaneously or substantially simultaneously.

Pre-Flight Diode Open Test Method

Some embodiments include a method of operating a power system for an aviation system, where the power system includes a plurality of battery management systems, each including a battery, a diode, first and second switches each configured to selectively conduct current from the battery to the diode, and a controller, and where the method includes: with the controller of a first battery management system of the battery management systems, causing the first switch of the first battery management system to be conductive, whereby current from the battery of the first battery management system is conducted to a first power supply node of the first battery management system; with the controller of a first battery management system of the battery management systems, causing the first and second switches of the first battery management system to be nonconductive; with the controller of the first battery management system, determining a voltage of the first power supply node while the first and second switches of the first battery management system are nonconductive; and, with the controller of the first battery management system, determining whether the diode of the first battery management system has an open based on the determined voltage of the first power supply node.

FIG. 5 is a flowchart diagram of a method 505 of detecting an open diode, for example, in a power management system, such as power management system 305, for example, used in a power distribution system, such as power distribution system 205, used, for example, in an aircraft, such as aircraft 100. The method may be performed, for example, by a processor or a controller, such as controller 225, as part of a pre-flight diode test routine.

At 515, a controller causes all batteries of all battery management systems connected to a power supply node, for example, connected to a load, to be electrically disconnected from the power supply node.

For example, the controller may cause switches, such as switches 328 and 338, of each battery management system to be nonconductive, such that the battery system, such as battery system 310, of the battery management systems are electrically disconnected from the power supply node, such as power supply node HVBUS. As a result, the load may not receive power from the battery systems 310 of the battery management systems, and does not function. Additionally, the load discharges the power supply node HVBUS, such that the voltage at the power supply node HVBUS becomes equal or substantially equal to or approaches a ground voltage.

At 525, the controller causes a first battery management system to electrically connect one or more batteries of the first battery management system to an internal node of the first battery management system, and therefore, to the power supply node if the diodes are not open.

For example, the controller may cause either or both of switches 328 and 338 of a first battery management system to be conductive, such that battery system 310 of the first battery management system is electrically connected with internal node HV of the first battery management system, and, therefore, to a power supply node HVBUS if first and second diodes 340 and 350 are not open. As a result, a load may receive power from battery system 310 of the first battery management system, and may accordingly function. If the controller causes switch 328 of the first battery management system to be conductive and does not cause switch 338 of the first battery management system to be conductive, the current from battery system 310 to the load will be less than if the controller were to cause switch 338 of the first battery management system to be conductive and to not cause switch 328 of the first battery management system to be conductive.

In some embodiments, the load, may have multiple functional modes, and the power from the battery system 310 of the first battery management system may cause the load to function in one or more of the functional modes of the load. For example, the load may include a motor for a lift fan 108 of an aircraft and/or a motor for a propeller 110 of the aircraft, such as aircraft 100, where the motor or motors have a first functional mode which causes the fan and/or propeller to rotate, and have a second functional mode which causes the motor or motors or a component of the motor or motors to sink current without causing the fan and/or propeller to rotate. The motor or motors may operate in the first functional mode while the aircraft is in flight. The motor or motors may operate in the second functional mode while the aircraft is on the ground not flying, for example, during a preflight test.

At 535, the controller causes the battery or battery system of the first battery management system to be electrically disconnected from the power supply node.

For example, the controller may cause switches 328 and 338 of the first battery management system to be nonconductive, such that battery system 310 of the first battery management system is electrically disconnected from the power supply node HVBUS.

As a result, the load discharges the power supply node HVBUS, such that the voltage at the power supply node HVBUS becomes equal or substantially equal to a ground voltage. In addition, if the first and second diodes 340 and 350 of the first battery management system are conductive, the load discharges the internal node HV of the first battery management system. However, if the first and second diodes 340 and 350 of the first battery management system are open, the load does not discharge the internal node HV of the first battery management system.

At 545, the controller receives a voltage indication signal and determines a voltage of an internal node of the first battery management system based on the voltage indication signal, where the internal node is expected to be electrically connected to the power supply node HVBUS by one or more diodes of the first battery management system and is electrically isolated from the battery system of the first battery management system. In some embodiments, the controller determines the voltage of the internal node after a delay time duration starting when the battery system of the first battery management system being electrically disconnected from the power supply node at 535. The delay time duration, for example, may be about 10 ms, about 100 ms, or another time duration.

For example, the controller may determine the voltage of internal node HV of the first battery management system, where the internal node HV is expected to be electrically connected to the power supply node HVBUS by the first and second diodes 340 and 350 of the first battery management system and is electrically isolated from the battery system 310 of the first battery management system because the switches 328 and 338 of the first battery management system are nonconductive.

Because the switches 328 and 338 of the first battery management system are nonconductive, and because internal node HV of the first battery management system is connected to the power supply node HVBUS by the first and second diodes 340 and 350 of the first battery management system, the voltage at the internal node HV of the first battery management system is expected to be affected by the change in voltage at the power supply node HVBUS resulting from the load discharging the power supply node HVBUS. However, if the first and second diodes 340 and 350 of the first battery management system are open, discharging the power supply node HVBUS will not discharge the internal nodes of the first battery management system.

At 555, based on the determined voltage of the internal node of the first battery management system, the controller determines whether the diodes of the first battery management system are open, or not sufficiently electrically connecting the first battery management system to the power supply node HVBUS. For example, if the determined voltage of the internal node is greater than a threshold voltage, the controller may determine that the diodes of the first battery management system are open, or are not sufficiently electrically connecting the first battery management system to the power supply node HVBUS.

For example, the controller may determine whether the voltage of internal node HV of the first battery management system is greater than a threshold voltage. If the controller determines that the voltage of the internal node HV of the first battery management system is less than the threshold voltage, because switches 328 and 338 of the first battery management system are nonconductive, the voltage of the internal node HV of the first battery management system being less than the threshold voltage indicates that the diodes 340 and 350 of the first battery management system are properly conductive, and effectively connect the internal node HV of the first battery management system to the power supply node HVBUS. If the controller determines that the voltage of the internal node HV of the first battery management system is greater than the threshold voltage, because switches 328 and 338 of the first battery management system are nonconductive, the voltage of the internal node HV of the first battery management system being greater than the threshold voltage indicates that diodes 340 and 350 of the first battery management system are not functioning properly, and are not effectively connecting the internal node HV of the first battery management system to the power supply node HVBUS. As a result, the controller determines diodes 340 and 350 of the first battery management system to be open.

In some embodiments, if the controller determines that the voltage of the internal node HV of the first battery management system is equal to the threshold voltage, the controller determines that the diodes 340 and 350 of the first battery management system are properly conductive, and effectively connect the internal node HV of the first battery management system to the power supply node HVBUS. In some embodiments, if the controller determines that the voltage of the internal node HV of the first battery management system is equal to the threshold voltage, the controller determines that the diodes 340 and 350 of the first battery management system are not functioning properly, and are not effectively connecting the internal node HV of the first battery management system to the power supply node HVBUS. As a result, the controller determines diodes 340 and 350 of the first battery management system to be open.

In some embodiments, in response to determining that diodes 340 and 350 of the first battery management system are open, the controller provides a signal indicating faulty diodes. In response to the signal, a pilot, a user, or an automatic system may cause one or more remedial actions to be taken. In some embodiments, in response to determining that diodes 340 and 350 of the first battery management system are open, the controller prevents switches 328 and 338 of the first battery management system from becoming conductive.

In alternative embodiments, the controller may determine whether either of diodes 340 and 350 of the first battery management system are open based on whether current measurement signals from the current monitors 360 and 370 of the second battery management system indicate current flowing from the first battery management system to power supply node HVBUS in response to the controller, at 525, causing the first battery management system to electrically connect one or more batteries of the first battery management system to the power supply node HVBUS, as understood by those of ordinary skill in the art.

The threshold voltage used at 555 may, for example, be determined based on a reference voltage. For example, the reference voltage may be based on a measurement or an expected value of the voltage at the power supply node HVBUS or of the battery system 310 of the first battery management system. In some embodiments, the controller may determine the threshold voltage to be a fraction of the reference voltage. For example, the controller may calculate the threshold voltage as about 0.05, about 0.1, about 0.2, about 0.5, or another factor times the reference voltage.

In some embodiments, prior to performing the method of FIG. 5, a test is performed to verify functionality of the battery system 310 of the first battery management system. In some embodiments, performing the method of FIG. 5 is conditioned on the test of the battery system 310 of the first battery management system verifying its functionality. In some embodiments, prior to performing the method of FIG. 5, a test is performed to verify functionality of the battery systems 310 of the all battery management systems of the power delivery system. In some embodiments, performing the method of FIG. 5 is conditioned on the test of the battery systems 310 of all of the battery management systems verifying their functionality.

In some embodiments, the method of FIG. 5 is repeated so as to determine whether a diode of one or more battery management systems other than the first battery management system is open. In some embodiments, the method of FIG. 5 is repeated so as to determine whether one or more diodes of all of the battery management systems of the power delivery system is open.

In some embodiments, the method of FIG. 5 is repeated so as to determine whether a diode of the first battery management system is open. For example, in the repeated instance of method 505, the second, or another battery management system may be or act as "the first battery management system" of the method, as described, and the first battery management system may be or act as "the second battery management system" of the method, as described.

In some embodiments, steps 535, 545, and 555 may be repeated so as to determine whether a diode of one or more other battery management systems, different from the first and second battery management systems is open. In some embodiments, the diodes of the second and at least one of the other battery management systems are, accordingly, tested simultaneously or substantially simultaneously.

During Flight Diode Test System

In some embodiments, a power system for an aviation system includes a plurality of battery management systems, each including one or more batteries, a first diode configured to conduct a first current from the batteries to a power supply conductor, a first current monitor configured to sense a first measurement value of the first current, a second diode configured to conduct a second current from the batteries to the power supply conductor, a second current monitor configured to sense a second measurement value of the second current, and a switch configured to conditionally electrically connect the batteries to the first and second diodes to conditionally cause the batteries to provide current to the power supply conductor. The power system also includes a controller, where the controller is configured to receive the first and second current values from the first and second current monitors of each particular battery management, and to control the conductivity of the switch of each particular battery management system based at least in part on the first and second current values.

The power system may be used, for example, for during-flight diode testing to determine a during flight diode short or a diode open in one or more battery management systems of the power system, as described below in greater detail.

During Flight Diode Short Test Method

Some embodiments include a method of operating a power system for an aviation system, where the power system including a plurality of battery management systems, each including a battery, first and second diodes, first and second current sensors, a switch configured to selectively conduct current from the battery to the diodes, and a controller, and where the method includes: with the controller of a first battery management system of the battery management systems, receiving first and second current values from the first and second current monitors of the first battery management system, where the first current value provides an indication of a first current amount flowing through the first diode of the first battery management system, and where the second current value provides an indication of a second current amount flowing through the second diode of the first battery management system; and, with the controller of the first battery management system, detecting a short in one of the first and second diodes by detecting that one of the first and second current values or a magnitude of one of the first and second current values is greater than a threshold.

Figure 6:
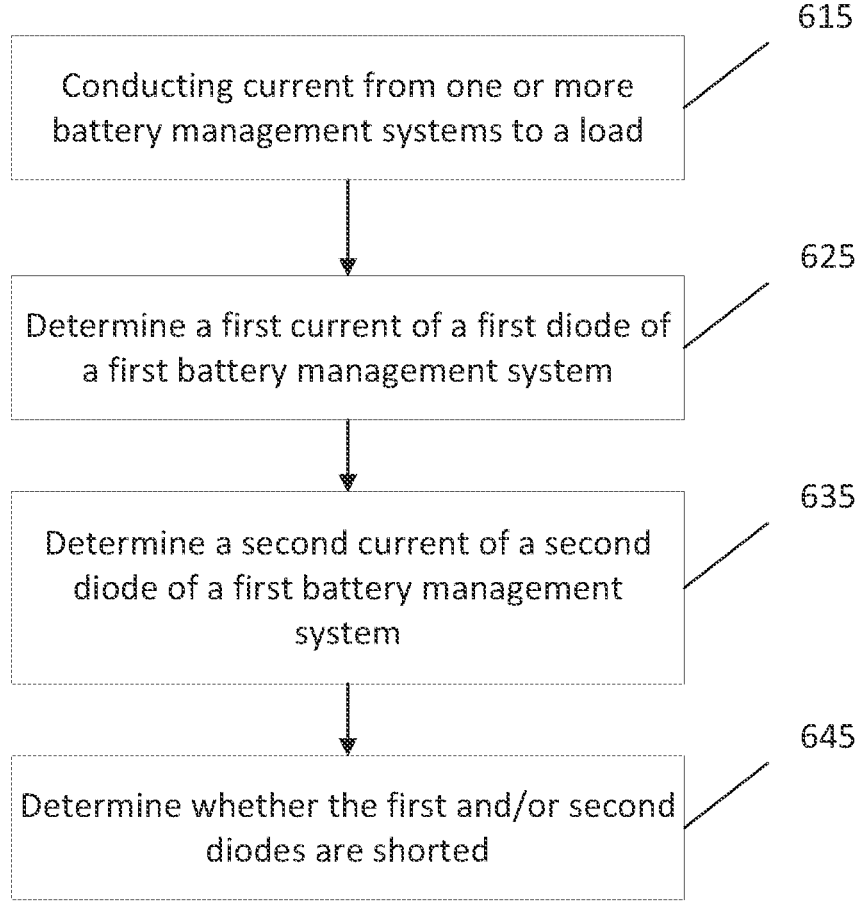
FIG. 6 is a flowchart diagram of a method of detecting a shorted diode, for example, in a power management system, such as the power management system of FIG. 3.

FIG. 6 is a flowchart diagram of a method 605 of detecting a shorted diode, for example, in a power management system, such as power management system 305, for example, used in a power distribution system, such as power distribution system 205, used, for example, in an aircraft, such as aircraft 100. The method may be performed, for example, by a processor or a controller, such as controller 225, as part of a during-flight diode test routine.

At 615, a controller causes a battery system of one or more battery management systems connected to a power supply node connected to a load, to provide power to load through the power supply node.

For example, the controller may cause switches, such as switches 328 and 338, of the one or more battery management systems to be conductive, such that the battery system, such as battery system 310, of the battery management systems are electrically connected to the power supply node, such as power supply node HVBUS. As a result, the load may receive power from the battery systems 310 of the one or more battery management systems, and functions.

In some embodiments, the load, may have multiple functional modes, and the power from the battery system 310 of the one or more battery management systems may cause the load to function in one or more of the functional modes of the load. For example, the load may include a motor for a lift fan 108 of an aircraft and/or a motor for a propeller 110 of the aircraft, such as aircraft 100, where the motor or motors have a first functional mode which causes the fan and/or propeller to rotate, and have a second functional mode which causes the motor or motors or a component of the motor or motors to sink current without causing the fan and/or propeller to rotate. The motor or motors may operate in the first functional mode while the aircraft is in flight. The motor or motors may operate in the second functional mode while the aircraft is on the ground not flying, for example, during a preflight test.

At 625, the controller may receive a first current indication signal and determine a current of the first diode 340 of a first battery management system based on the first current indication signal.

For example, the controller may receive a first current measurement signal from a first current monitor 360 of the first battery management system, where the first current measurement signal may indicate a magnitude and direction of current flowing from the first battery management system to the power supply node HVBUS through the first diode 340. In some embodiments, the first current measurement signal may additionally or alternatively indicate other aspects of the current flowing from the first battery management system to the power supply node HVBUS through the first diode 340, as understood by those of skill in the art.

At 635, the controller may receive a second current indication signal and determine a current of the second diode 350 of the first battery management system based on the second current indication signal.

For example, the controller may receive a second current measurement signal from a second current monitor 370 of the first battery management system, where the second current measurement signal may indicate a magnitude and direction of current flowing from the first battery management system to the power supply node HVBUS through the second diode 350. In some embodiments, the first current measurement signal may additionally or alternatively indicate other aspects of the current flowing from the first battery management system to the power supply node HVBUS through the second diode 350, as understood by those of skill in the art.

At 645, based on the first current measurement signal from the first current monitor 360 of the first battery management system, the controller may determine whether the first diode 340 of the first battery management system is shorted.

For example, the controller may determine whether the current of the first diode 340 of the first battery management system is greater than a threshold current. If the controller determines that the current of the first diode 340 of the first battery management system is greater than the threshold current, the controller may determine that the first diode 340 of the first battery management system is shorted, for example, because a diode current greater than the threshold current may indicate that the diode is shorted. If the controller determines that the current of the first diode 340 of the first battery management system is less than the threshold current, the controller may determine that the first diode 340 of the first battery management system is not shorted, for example, because a diode current less than the threshold current may indicate that the diode is functioning properly.

In some embodiments, if the controller determines that the current of the first diode 340 of the first battery management system is equal to the threshold current, the controller may determine that the first diode 340 of the first battery management system is shorted. In some embodiments, if the controller determines that the current of the first diode 340 of the first battery management system is equal to threshold current, the controller may determine that the first diode 340 of the first battery management system is not shorted.

In some embodiments, in response to determining that the first diode 340 of the first battery management system is shorted, the controller provides a signal indicating a faulty diode. In response to the signal, a pilot, a user, or an automatic system may cause one or more remedial actions to be taken. In some embodiments, in response to determining that the first diode 340 of the first battery management system is shorted, the controller prevents switches 328 and 338 of the first battery management system from becoming conductive. Additionally, or alternatively, the in response to the signal, the pilot, user, or automatic system may take other remedial action, such as landing the aircraft, for example, for repair or maintenance. Other actions may be additionally or alternatively taken in response to the signal.

At 645, additionally or alternatively, the controller may determine whether the second diode 350 of the first battery management system is shorted based on the second current measurement signal from the second current monitor 360 of the first battery management system.

For example, the controller may determine whether the current of the second diode 350 of the first battery management system is greater than a threshold current. If the controller determines that the current of the second diode 350 of the first battery management system is greater than the threshold current, the controller may determine that the second diode 350 of the first battery management system is shorted, for example, because a diode current greater than the threshold current may indicate that the diode is shorted. If the controller determines that the current of the second diode 350 of the first battery management system is less than the threshold current, the controller may determine that the second diode 350 of the first battery management system is not shorted, for example, because a diode current less than the threshold current may indicate that the diode is functioning properly.

In some embodiments, if the controller determines that the current of the second diode 350 of the first battery management system is equal to the threshold current, the controller may determine that the second diode 350 of the first battery management system is shorted. In some embodiments, if the controller determines that the current of the second diode 350 of the first battery management system is equal to threshold current, the controller may determine that the second diode 350 of the first battery management system is not shorted.

In some embodiments, in response to determining that the second diode 350 of the first battery management system is shorted, the controller provides a signal indicating a faulty diode. In response to the signal, a pilot, a user, or an automatic system may cause one or more remedial actions to be taken. In some embodiments, in response to determining that the second diode 350 of the first battery management system is shorted, the controller prevents switches 328 and 338 of the first battery management system from becoming conductive. Additionally, or alternatively, the in response to the signal, the pilot, user, or automatic system may take other remedial action, such as landing the aircraft, for example, for repair or maintenance. Other actions may be additionally or alternatively taken in response to the signal.

The threshold current used at 645 may, for example, be determined by, for example, the controller based on current measurement signals from the first battery management system and from other battery management systems. For example, threshold current used at 645 may, for example, be determined based on current measurement signals from all of the battery management systems of the power delivery system. For example, in some embodiments, the threshold current is determined based on or is an average diode current or a filtered average diode current determined based on current measurement signals from one or more or all of the battery management systems of the power delivery system. In some embodiments, the threshold current is equal to about 1.5 times the average or filtered average diode current. In some embodiments, the threshold current is equal to about 1.5 times the average or filtered average diode current plus a margin current, such as 1 A.

In some embodiments, the threshold current is 0 A and the margin current is 0 A, such that any detected current flowing through the first diode 340 from the power supply node HVBUS to battery system 310 provides an indication that the first diode 340 is shorted, and such that any detected current flowing through the second diode 340 from the power supply node HVBUS to battery system 310 provides an indication that the first diode 340 is shorted.

In some embodiments, prior to performing the method of FIG. 6, a test is performed to verify functionality of the battery system 310 of the first battery management system. In some embodiments, performing the method of FIG. 6 is conditioned on the test of the battery system 310 of the first battery management system verifying its functionality. In some embodiments, prior to performing the method of FIG. 6, a test is performed to verify functionality of the battery systems 310 of the all battery management systems of the power delivery system. In some embodiments, performing the method of FIG. 6 is conditioned on the test of the battery systems 310 of all of the battery management systems verifying their functionality.

In some embodiments, the method of FIG. 6 is repeated so as to determine whether a diode of one or more battery management systems other than the first battery management system is shorted. In some embodiments, the method of FIG. 6 is repeated so as to determine whether one or more diodes of all of the battery management systems of the power delivery system is shorted.

During Flight Diode Open Test Method

Some embodiments include a method of operating a power system for an aviation system, where the power system includes a plurality of battery management systems, each including a battery, first and second diodes, first and second current sensors, a switch configured to selectively conduct current from the battery to the diodes, and a controller, and where the method includes: with the controller of a first battery management system of the battery management systems, receiving first and second current values from the first and second current monitors of the first battery management system, where the first current value provides an indication of a first current amount flowing through the first diode of the first battery management system, and where the second current value provides an indication of a second current amount flowing through the second diode of the first battery management system; and, with the controller of the first battery management system, detecting an open in one of the first and second diodes by detecting that one of the first and second current values is less than a threshold.

Figure 7:
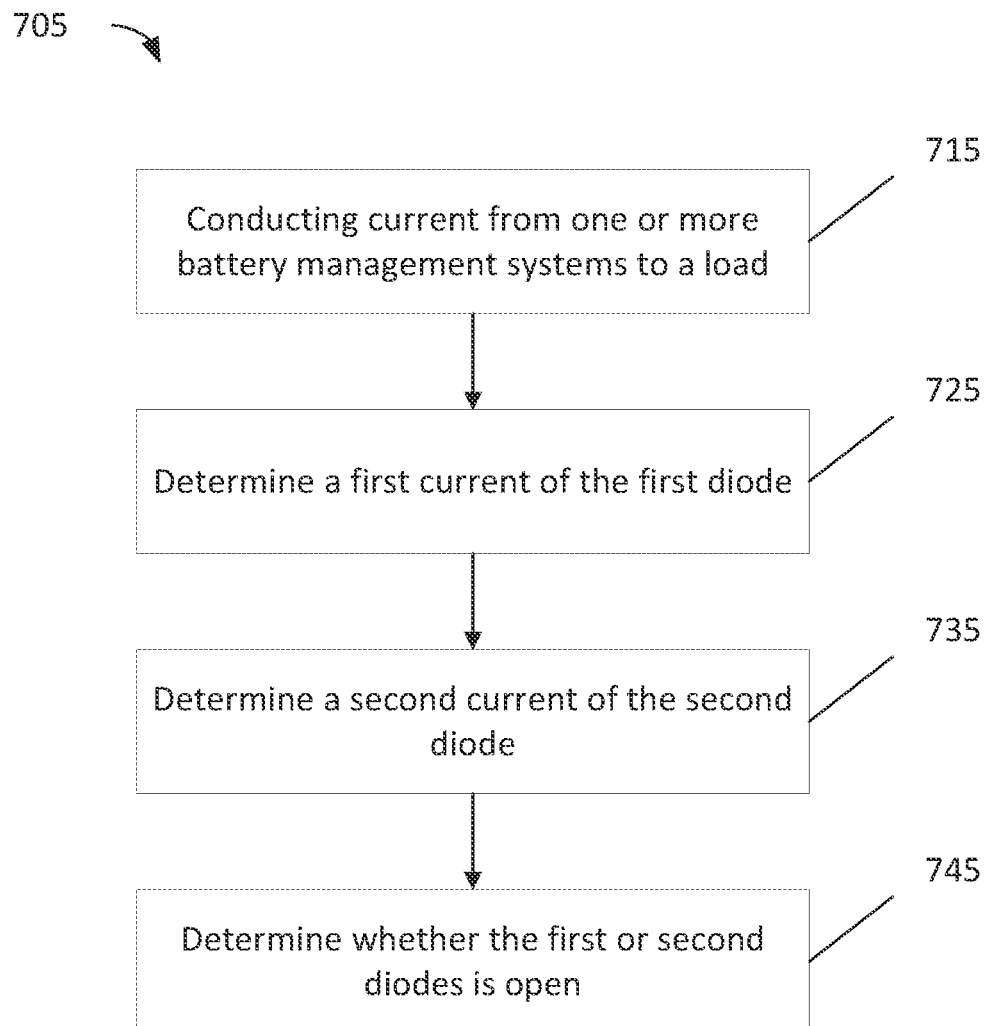
FIG. 7 is a flowchart diagram of a method of detecting an open diode, for example, in a power management system, such as the power management system of FIG. 3.

FIG. 7 is a flowchart diagram of a method 705 of detecting an open diode, for example, in a power management system, such as power management system 305, for example, used in a power distribution system, such as power distribution system 205, used, for example, in an aircraft, such as aircraft 100. The method may be performed, for example, by a processor or a controller, such as controller 225, as part of a during-flight diode test routine.

At 715, a controller causes a battery system of one or more battery management systems connected to a power supply node connected to a load, to provide power to load through the power supply node.

For example, the controller may cause switches, such as switches 328 and 338, of the one or more battery management systems to be conductive, such that the battery system, such as battery system 310, of the battery management systems are electrically connected to the power supply node, such as power supply node HVBUS. As a result, the load may receive power from the battery systems 310 of the one or more battery management systems, and functions.

In some embodiments, the load, may have multiple functional modes, and the power from the battery system 310 of the one or more battery management systems may cause the load to function in one or more of the functional modes of the load. For example, the load may include a motor for a lift fan 108 of an aircraft and/or a motor for a propeller 110 of the aircraft, such as aircraft 100, where the motor or motors have a first functional mode which causes the fan and/or propeller to rotate, and have a second functional mode which causes the motor or motors or a component of the motor or motors to sink current without causing the fan and/or propeller to rotate. The motor or motors may operate in the first functional mode while the aircraft is in flight. The motor or motors may operate in the second functional mode while the aircraft is on the ground not flying, for example, during a preflight test.

At 725, the controller may receive a first current indication signal and determine a current of the first diode 340 of a first battery management system based on the first current indication signal.

For example, the controller may receive a first current measurement signal from a first current monitor 360 of the first battery management system, where the first current measurement signal may indicate a magnitude and direction of current flowing from the first battery management system to the power supply node HVBUS through the first diode 340. In some embodiments, the first current measurement signal may additionally or alternatively indicate other aspects of the current flowing from the first battery management system to the power supply node HVBUS through the first diode 340, as understood by those of skill in the art.

At 735, the controller may receive a second current indication signal and determine a current of the second diode 350 of the first battery management system based on the second current indication signal.

For example, the controller may receive a second current measurement signal from a second current monitor 370 of the first battery management system, where the second current measurement signal may indicate a magnitude and direction of current flowing from the first battery management system to the power supply node HVBUS through the second diode 350. In some embodiments, the first current measurement signal may additionally or alternatively indicate other aspects of the current flowing from the first battery management system to the power supply node HVBUS through the second diode 350, as understood by those of skill in the art.

At 745, based on the first current measurement signal from the first current monitor 360 of the first battery management system, the controller may determine whether the first diode 340 of the first battery management system is open.

For example, the controller may determine whether the current of the first diode 340 of the first battery management system is less than a threshold current. If the controller determines that the current of the first diode 340 of the first battery management system is less than the threshold current, the controller may determine that the first diode 340 of the first battery management system is open, for example, because a diode current less than the threshold current may indicate that the diode is open. If the controller determines that the current of the first diode 340 of the first battery management system is greater than the threshold current, the controller may determine that the first diode 340 of the first battery management system is not open, for example, because a diode current greater than the threshold current may indicate that the diode is functioning properly.

In some embodiments, if the controller determines that the current of the first diode 340 of the first battery management system is equal to the threshold current, the controller may determine that the first diode 340 of the first battery management system is open. In some embodiments, if the controller determines that the current of the first diode 340 of the first battery management system is equal to threshold current, the controller may determine that the first diode 340 of the first battery management system is not open.

In some embodiments, in response to determining that the first diode 340 of the first battery management system is open, the controller provides a signal indicating a faulty diode. In response to the signal, a pilot, a user, or an automatic system may cause one or more remedial actions to be taken. In some embodiments, in response to determining that the first diode 340 of the first battery management system is open, the controller prevents switches 328 and 338 of the first battery management system from becoming conductive. Additionally, or alternatively, the in response to the signal, the pilot, user, or automatic system may take other remedial action, such as landing the aircraft, for example, for repair or maintenance. Other actions may be additionally or alternatively taken in response to the signal.

At 745, additionally or alternatively, the controller may determine whether the second diode 350 of the first battery management system is open based on the second current measurement signal from the second current monitor 360 of the first battery management system.

For example, the controller may determine whether the current of the second diode 350 of the first battery management system is less than a threshold current. If the controller determines that the current of the second diode 350 of the first battery management system is less than the threshold current, the controller may determine that the second diode 350 of the first battery management system is open, for example, because a diode current less than the threshold current may indicate that the diode is open. If the controller determines that the current of the second diode 350 of the first battery management system is greater than the threshold current, the controller may determine that the second diode 350 of the first battery management system is not open, for example, because a diode current greater than the threshold current may indicate that the diode is functioning properly.

In some embodiments, if the controller determines that the current of the second diode 350 of the first battery management system is equal to the threshold current, the controller may determine that the second diode 350 of the first battery management system is open. In some embodiments, if the controller determines that the current of the second diode 350 of the first battery management system is equal to threshold current, the controller may determine that the second diode 350 of the first battery management system is not open.

In some embodiments, in response to determining that the second diode 350 of the first battery management system is open, the controller provides a signal indicating a faulty diode. In response to the signal, a pilot, a user, or an automatic system may cause one or more remedial actions to be taken. In some embodiments, in response to determining that the second diode 350 of the first battery management system is open, the controller prevents switches 328 and 338 of the first battery management system from becoming conductive. Additionally, or alternatively, the in response to the signal, the pilot, user, or automatic system may take other remedial action, such as landing the aircraft, for example, for repair or maintenance. Other actions may be additionally or alternatively taken in response to the signal.

The threshold current used at 745 may, for example, be determined, for example, by the controller based on current measurement signals from the first battery management system and from other battery management systems. For example, threshold current used at 745 may, for example, be determined based on current measurement signals from all of the battery management systems of the power delivery system. For example, in some embodiments, the threshold current is determined based on or is an average diode current or a filtered average diode current determined based on current measurement signals from one or more or all of the battery management systems of the power delivery system. In some embodiments, the threshold current is equal to about 0.5 times the average or filtered average diode current. In some embodiments, the threshold current is equal to about 0.5 times the average or filtered average diode current minus a margin current, such as 1 A.

In some embodiments, prior to performing the method of FIG. 7, a test is performed to verify functionality of the battery system 310 of the first battery management system. In some embodiments, performing the method of FIG. 7 is conditioned on the test of the battery system 310 of the first battery management system verifying its functionality. In some embodiments, prior to performing the method of FIG. 7, a test is performed to verify functionality of the battery systems 310 of the all battery management systems of the power delivery system. In some embodiments, performing the method of FIG. 7 is conditioned on the test of the battery systems 310 of all of the battery management systems verifying their functionality.

In some embodiments, the method of FIG. 7 is repeated so as to determine whether a diode of one or more battery management systems other than the first battery management system is open. In some embodiments, the method of FIG. 7 is repeated so as to determine whether one or more diodes of all of the battery management systems of the power delivery system is open.

Figure 8:
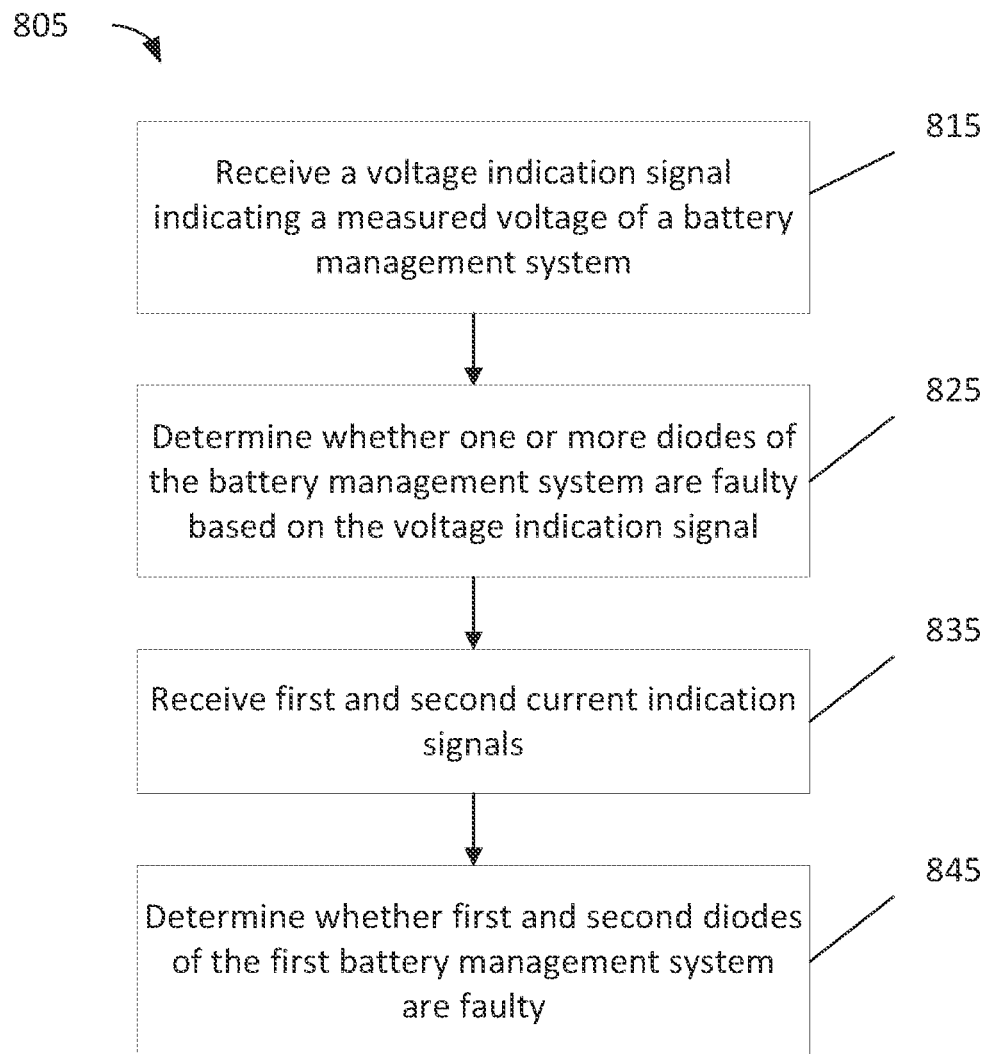
FIG. 8 is a flowchart diagram of a method of detecting one or more faulty diodes, for example, in a power management system, such as the power management system of FIG. 3.

FIG. 8 is a flowchart diagram of a method 805 of detecting one or more faulty diodes, for example, in a power management system, such as the power management system of FIG. 3. The method may be performed, for example, with power delivery system for an aircraft. In some embodiments, the power delivery system includes: a plurality of battery management systems, each comprising: a battery system, and first and second diodes configured to conduct current from the battery system to a power supply node.

At 815, a controller receives a voltage indication signal indicating a measured voltage of a first battery management system of the battery management systems. For example, the controller may receive a voltage indication signal, such as those discussed above with reference to 435 and/or 545 of FIGS. 4 and 5, respectively.

At 825, the controller determines whether one or more diodes of the first battery management system are faulty based on the voltage indication signal. For example, the controller may determine whether the diodes of the first battery management system are faulty using aspects of methods 405 and 505, such as at 445 and 555, discussed above with reference to FIGS. 4 and 5, respectively.

At 835, the controller receives first and second current indication signals from the first battery management system. For example, the controller may receive first and second current indication signals, such as those discussed above with reference to 625 and 635 of FIG. 4 and/or to 725 and 735 of FIG. 5.

At 845, the controller determines whether the first and second diodes of the first battery management system are faulty based on the first and second current indication signals. For example, the controller may determine whether the diodes of the first battery management system are faulty using aspects of methods 605 and 705, such as at 645 and 745, discussed above with reference to FIGS. 6 and 7, respectively.

In some embodiments, the controller is configured to determine whether either of the first and second diodes of the first battery management system is shorted based on the first and second current indication signals while the aircraft is flying.

In some embodiments, the controller is configured to determine whether either of the first and second diodes of the first battery management system is open based on the first and second current indication signals while the aircraft is flying.

In some embodiments, the controller is configured to determine whether either of the first and second diodes of the first battery management system is shorted based on the voltage indication signal while the aircraft is not flying.

In some embodiments, the controller is configured to determine whether the first and second diodes of the first battery management system are open based on the voltage indication signal while the aircraft is not flying.

Various voltages are discussed herein as being greater or less than a threshold voltage. As understood by those of skill in the art, a voltage being greater than a threshold voltage may encompass situations where the magnitude of the voltage is greater than the threshold voltage, such that, for example, a negative voltage having a greater magnitude than a threshold voltage may be described as the negative voltage being greater than the threshold voltage. Similarly, as understood by those of skill in the art, a voltage being less than a threshold voltage may encompass situations where the magnitude of the voltage is less than a magnitude of the threshold voltage, such that, for example, a negative voltage having a lesser magnitude than a magnitude of the threshold voltage may be described as the negative voltage being less than the threshold voltage.

Various currents are discussed herein as being greater or less than a threshold current. As understood by those of skill in the art, a current being greater than a threshold current may encompass situations where the magnitude of the current is greater than the threshold current, such that, for example, a negative current having a greater magnitude than a threshold current may be described as the negative current being greater than the threshold current. Similarly, as understood by those of skill in the art, a current being less than a threshold current may encompass situations where the magnitude of the current is less than a magnitude of the threshold current, such that, for example, a negative current having a lesser magnitude than a magnitude of the threshold current may be described as the negative current being less than the threshold current.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system may include clients and servers. A client and server are generally remote from each other and typically interact through a communication network. The relationship of client and server arises by virtue of computer programs running on the respective computers and having a client-server relationship to each other.

These computer programs, which can also be referred to as programs, software, software applications, applications, components, or code, include machine instructions for a programmable processor, and can be implemented in a high-level procedural language, an object-oriented programming language, a functional programming language, a logical programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively or additionally store such machine instructions in a transient manner, such as for example as would a processor cache or other random access memory associated with one or more physical processor cores.

To provide for interaction with a user, one or more aspects or features of the subject matter described herein can be implemented on a computer having a display device, such as for example a cathode ray tube (CRT) or a liquid crystal display (LCD) or a light emitting diode (LED) monitor for displaying information to the user and a keyboard and a pointing device, such as for example a mouse or a trackball, by which the user may provide input to the computer. Other kinds of devices can be used to provide for interaction with a user as well. For example, feedback provided to the user can be any form of sensory feedback, such as for example visual feedback, auditory feedback, or tactile feedback; and input from the user may be received in any form, including, but not limited to, acoustic, speech, or tactile input. Other possible input devices include, but are not limited to, touch screens or other touch-sensitive devices such as single or multi-point resistive or capacitive trackpads, voice recognition hardware and software, optical scanners, optical pointers, digital image capture devices and associated interpretation software, and the like.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

The invention claimed is:

1. A power delivery system for an aircraft, the power delivery system comprising:
    a plurality of battery management systems, each comprising:
        a battery system,
        first and second diodes configured to conduct current from the battery system to a power supply node,
        a first current sensor configured to sense a first current of the first diode,
        a second current sensor configured to sense a second current of the second diode,
        a first switch configured to control a conductivity of a first current path between the battery system and the first and second diodes, and
        a second switch configured to control a conductivity of a second current path between the battery system and the first and second diodes; and
    a controller, wherein the controller is configured to receive a voltage indication signal indicating a measured voltage of a first battery management system of the battery management systems and to determine whether the first and second diodes of the first battery management system are faulty based on the voltage indication signal, and wherein the controller is configured to respectively receive first and second current indication signals from the first and second current sensors of the first battery management system and to determine whether the first and second diodes of the first battery management system are faulty based on the first and second current indication signals.

2. The power delivery system of claim 1, wherein the controller is configured to determine whether the first and second diodes are open based on the voltage indication signal.

3. The power delivery system of claim 1, wherein the controller is configured to determine whether either of the first and second diodes are shorted based on the voltage indication signal.

4. The power delivery system of claim 1, wherein the first current path has a first impedance when conductive, wherein the second current path has a second impedance when conductive, and wherein the first impedance is greater than the second impedance.

5. The power delivery system of claim 1, wherein the controller is configured to electrically connect the battery system of a second battery management system to the power supply node, and to determine whether either of the first and second diodes of the first battery management system are shorted based on the voltage indication signal.

6. The power delivery system of claim 5, wherein the controller is configured to determine that either or both of the first and second diodes of the first battery management system are shorted based on the voltage indication signal indicating that the measured voltage of the first battery management system is greater than a threshold.

7. The power delivery system of claim 5, wherein the controller is configured to determine whether either of the first and second diodes of the first battery management system are shorted during a preflight test while the aircraft is not flying.

8. The power delivery system of claim 1, wherein the controller is configured to electrically connect the battery system of the first battery management system to the first and second diodes of the first battery management system, to electrically disconnect the battery system of the first battery management system from the first and second diodes of the first battery management system, and to determine whether either of the first and second diodes of the first battery management system are open based on the voltage indication signal.

9. The power delivery system of claim 8, wherein the controller is configured to determine that the first and second diodes of the first battery management system are open based on the voltage indication signal indicating that the measured voltage of the first battery management system is greater than a threshold.

10. The power delivery system of claim 8, wherein the controller is configured to determine whether either of the first and second diodes of the first battery management system are open during a preflight test while the aircraft is not flying.

11. The power delivery system of claim 1, wherein the controller is configured to determine whether either of the first and second diodes of the first battery management system is open based on the first and second current indication signals.

12. The power delivery system of claim 11, wherein the controller is configured to determine whether the first diode of the first battery management system is open based on the first current indication signal being less than a threshold, and wherein the controller is configured to determine whether the second diode of the first battery management system is open based on the second current indication signal being less than the threshold.

13. The power delivery system of claim 11, wherein the controller is configured to determine whether either of the first and second diodes of the first battery management system is open while the aircraft is flying.

14. The power delivery system of claim 1, wherein the controller is configured to determine whether either of the first and second diodes is shorted based on the first and second current indication signals.

15. The power delivery system of claim 14, wherein the controller is configured to determine whether the first diode of the first battery management system is shorted based on the first current indication signal being greater than a threshold, and wherein the controller is configured to determine whether the second diode of the first battery management system is shorted based on the second current indication signal being greater than the threshold.

16. The power delivery system of claim 14, wherein the controller is configured to determine whether either of the first and second diodes of the first battery management system is shorted while the aircraft is flying.

17. A method of operating a power delivery system for an aircraft, the power delivery system comprising: a plurality of battery management systems, each comprising: a battery system, and first and second diodes configured to conduct current from the battery system to a power supply node, the method comprising:
    with a controller, receiving a voltage indication signal indicating a measured voltage of a first battery management system of the battery management systems;
    with the controller, determining whether the first and second diodes of the first battery management system are faulty based on the voltage indication signal;

with the controller, respectively receiving first and second current indication signals from the first battery management system; and with the controller, determining whether the first and second diodes of the first battery management system are faulty based on the first and second current indication signals.

18. The method of claim 17, wherein the controller is configured to determine whether either of the first and second diodes of the first battery management system is shorted based on the first and second current indication signals while the aircraft is flying.

19. The method of claim 17, wherein the controller is configured to determine whether either of the first and second diodes of the first battery management system is open based on the first and second current indication signals while the aircraft is flying.

20. The method of claim 17, wherein the controller is configured to determine whether either of the first and second diodes of the first battery management system is shorted based on the voltage indication signal while the aircraft is not flying.

21. The method of claim 17, wherein the controller is configured to determine whether the first and second diodes of the first battery management system are open based on the voltage indication signal while the aircraft is not flying.

* * * * *